US009406354B1

(12) United States Patent
Jung et al.

(10) Patent No.: US 9,406,354 B1
(45) Date of Patent: Aug. 2, 2016

(54) SYSTEM, APPARATUS, AND METHOD FOR AN OFFSET CANCELLING SINGLE ENDED SENSING CIRCUIT

(71) Applicants: QUALCOMM Incorporated, San Diego, CA (US); Industry-Academic Cooperation Foundation, Yonsei University, Seoul (KR)

(72) Inventors: Seong-Ook Jung, Seoul (KR); Taehui Na, Seoul (KR); Jisu Kim, Seoul (KR); Jung Pill Kim, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/693,755

(22) Filed: Apr. 22, 2015

(51) Int. Cl.
G11C 7/00 (2006.01)
G11C 7/08 (2006.01)
G11C 7/10 (2006.01)
G11C 7/22 (2006.01)

(52) U.S. Cl.
CPC .. *G11C 7/08* (2013.01); *G11C 7/10* (2013.01); *G11C 7/1051* (2013.01); *G11C 7/22* (2013.01)

(58) Field of Classification Search
CPC ....... G11C 7/1051; G11C 7/22; G11C 7/1072
USPC ............ 365/189.15, 185.21, 185.2, 205, 207, 365/189.07
IPC ................................ G11C 7/1051, 7/22, 7/1072
See application file for complete search history.

(56) References Cited

U.S. PATENT DOCUMENTS

| 6,392,944 | B1 | 5/2002 | Kono | |
| 7,642,815 | B2* | 1/2010 | Fort | G11C 7/067 |
| | | | | 327/51 |
| 7,852,243 | B2 | 12/2010 | Hwang et al. | |
| 8,072,790 | B2 | 12/2011 | Kim | |
| 8,477,552 | B2 | 7/2013 | Kajigaya et al. | |
| 8,605,528 | B2 | 12/2013 | Barth, Jr. et al. | |
| 2001/0030893 | A1* | 10/2001 | Terzioglu | G11C 7/06 |
| | | | | 365/200 |
| 2015/0221365 | A1* | 8/2015 | Park | G11C 13/004 |
| | | | | 365/163 |

OTHER PUBLICATIONS

Kim J., et al.,"A Novel Sensing Circuit for Deep Submicron Spin Transfer Torque MRAM (STT-MRAM)," IEEE Transactions on Very Large Scale Integration (VLSI) Systems, vol. 20, No. 1, Jan. 2012, pp. 181-186.
Kim J.P., et al., "A 45nm 1Mb Embedded STT-MRAM with Design Techniques to Minimize Read-Disturbance," 2011 Symposium on VLSI Circuits Digest of Technical Papers, Jun. 2011,pp. 296-297.
Na T., et al., "Comparative Study of Various Latch-Type Sense Amplifiers," IEEE Transactions on Very Large Scale Integration (VLSI) Systems, vol. 22, No. 2, Feb. 2014, pp. 425-429.

* cited by examiner

*Primary Examiner* — Connie Yoha
(74) *Attorney, Agent, or Firm* — Muncy, Geissler, Olds & Lowe, P.C.

(57) ABSTRACT

A read circuit for a memory cell may include an integrated logic circuit for sensing a current change. The integrated logic sensing circuit may be an offset cancelling single ended integrated logic sensing circuit. The circuit may include an offset canceling single ended sensing circuit coupled to a supply voltage, an offset canceling single ended sense amplifier circuit having a sense amplifier input coupled to the offset canceling single ended sensing circuit and a sense amplifier output, and a cell array coupled to a sensing circuit output and a ground.

19 Claims, 6 Drawing Sheets

SYSTEM, APPARATUS, AND METHOD FOR AN OFFSET CANCELLING SINGLE ENDED SENSING CIRCUIT

FIELD OF DISCLOSURE

This disclosure relates generally to integrated logic sensing circuits, and more specifically, but not exclusively, to an offset cancelling single ended integrated logic sensing circuit.

BACKGROUND

In conventional computer memory, a sense amplifier is one of the elements that make up the circuitry on a semiconductor memory chip (integrated circuit). A sense amplifier is part of the read circuitry that is used when data is read from the memory; its role is to sense the low power signals from a bit line that represents a data bit (1 or 0) stored in a memory cell, and amplify the small voltage swing or margin to recognizable logic levels so the data can be interpreted properly by logic outside the memory. Typical sense-amplifier circuits consist of two to six (usually four) transistors. Generally, there is one sense amplifier for each column of memory cells, so there may be hundreds or thousands of identical sense amplifiers on a modern memory chip.

In conventional sense amplifiers, however, the sensing margin is degraded with technology scaling due to a decrease in supply voltage, an increase in process variation, and limited sensing current to prevent read disturbances. To combat these problems, designers have turned to tighter magnetic tunnel junction (MTJ) resistance (RL and RH) distributions, higher TMR, or novel bit-cell structures (e.g., separated read and write paths). Unfortunately, these solutions have their own problems, such as poor sense margins and slow speeds along with issues in manufacturing process variations that result in widely varying performance of the circuits. In general, the degradation in the sensing margin is overcome by using offset-canceling circuits. However, these circuits have inherent performance degradation because of the use of a multi-stage sensing operation. Additionally, low energy has become one of the primary concerns with technology scaling due to an exponential increase in leakage current, limited battery capacity in hand-held devices, and limited device scaling (limited scaling of supply voltage, threshold voltage, and gate oxide thickness) makes Dennard scaling stop at 90 nm. That is, transistor area continues to scale at the historic rate, which allows for doubling the number of transistors, while the power per transistor is not scaling at the same rate, leading to the increase in chip power.

Accordingly, there is a need for systems, apparatus, and methods that improve upon conventional approaches including the improved methods, system and apparatus provided hereby. The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for an integrated logic sensing circuit, including: an offset canceling single ended sensing circuit coupled to a supply voltage and having a sense circuit output; an offset canceling single ended sense amplifier circuit having a sense amplifier input coupled to the offset canceling single ended sensing circuit and a sense amplifier output; a voltage clamp transistor coupled after the sense circuit output; and a cell array coupled to the voltage clamp transistor and a ground.

Some examples of the disclosure are directed to systems, apparatus, and methods for a sensing system, including: a sensing circuit, the sensing circuit being an offset-canceling single ended sensing circuit; a sense amplifier coupled to the sensing circuit, the sense amplifier being an offset-canceling single ended sense amplifier; an equalization transistor coupled to the sensing circuit and configured to selectively couple a select line transistor to the sensing circuit; and a word line transistor coupled to the sensing circuit and in parallel with the equalization transistor, the word line transistor configured to selectively couple the select line transistor to the sensing circuit.

Some examples of the disclosure are directed to systems, apparatus, and methods for sensing and amplifying a current in a memory cell, including: executing a first phase of operation for an integrated logic circuit coupled to the memory cell, the first phase of operation pre-charging a bit line transistor in the integrated logic circuit and equalizing a sense amplifier in the integrated logic circuit; executing a second phase of operation for the integrated logic circuit, the second phase of operation developing an output voltage of a sensing circuit from a reference voltage to a data voltage and amplifying an output voltage of sense amplifier; and executing a third phase of operation for the integrated logic circuit, the third phase latching a rail to rail voltage to a value defined by a difference the output voltage of the sensing circuit and an input voltage of the sensing circuit.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
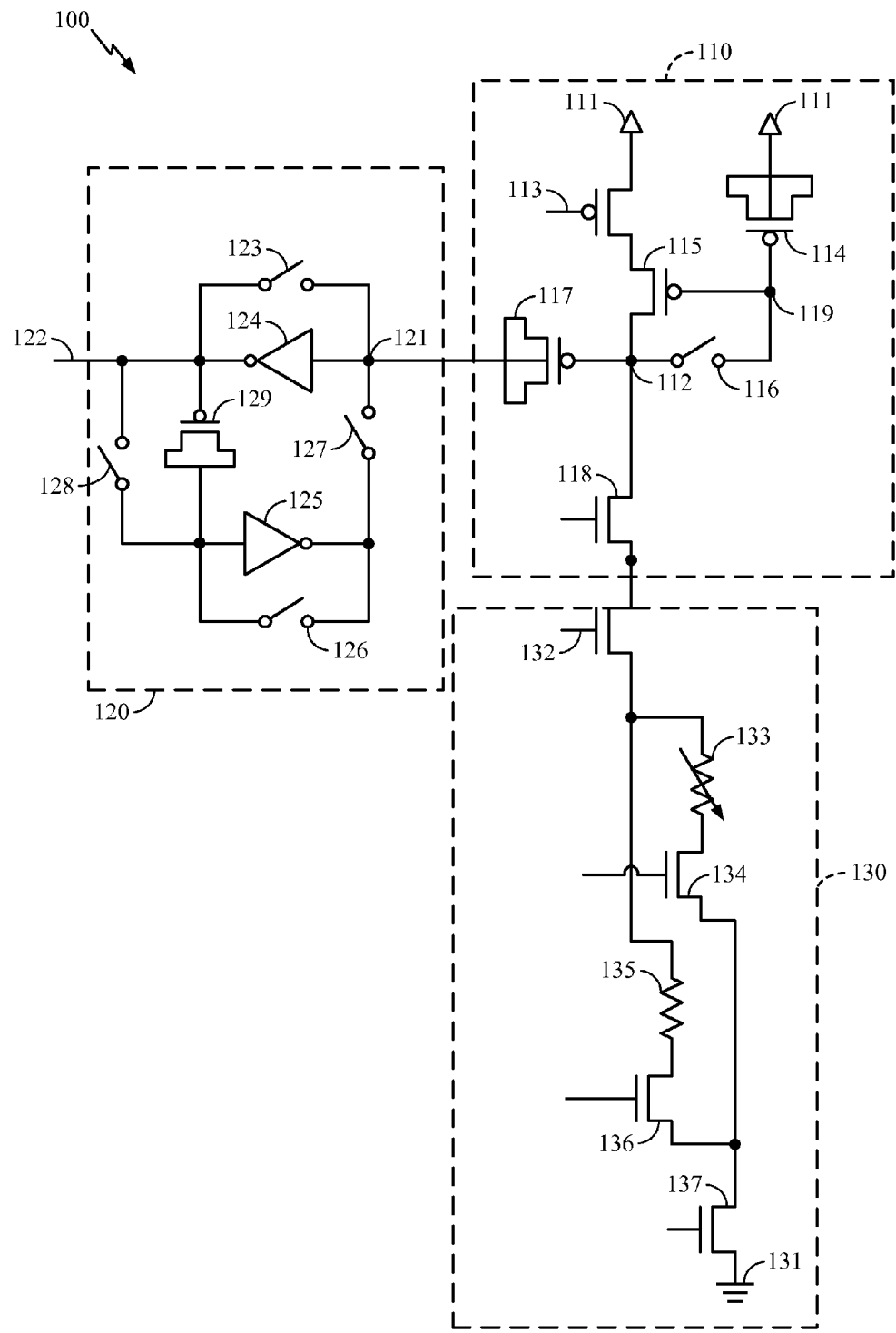
FIG. 1 illustrates an exemplary integrated logic circuit in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the long-felt industry needs, as well as other previously unidentified needs, and mitigate shortcomings of the conventional methods, apparatus, and systems. For example, examples disclosed herein have a low read energy due to the lack of a reference branch structure and fast sensing time, high sensing margin due to offset cancellation, high speed due to offset cancellation without sacrificing performance, high read disturbance margin because of no read disturbance in initial bit line pre-charge and equalization phase and shorter second voltage development and amplification phase, and small layout area because of the lack of a reference branch and relatively small size of the transistors.

FIG. 1 illustrates an exemplary integrated logic circuit in accordance with some examples of the disclosure. As shown in FIG. 1, an integrated logic sensing circuit 100 may include an offset canceling single ended sensing circuit 110 coupled to a supply voltage 111, an offset canceling single ended sense amplifier circuit 120 having a sense amplifier input 121 coupled to the offset canceling single ended sensing circuit 110 and a sense amplifier output 122, and a cell array 130 coupled to a sensing circuit output 112 and a ground 131.

The offset canceling single ended sensing circuit 110 may include a degeneration latch transistor 113 coupled to the supply voltage 111, a first capacitor 114 coupled to the supply voltage, a first transistor 115 coupled to the degeneration latch transistor 113 and the first capacitor 114, a first equalization switch 116 coupled to the first capacitor 114 and the first transistor 115, a second capacitor 117 coupled to the first equalization switch 116 and the first transistor 115, and a voltage clamp transistor 118 coupled after the sense circuit output 112 and the first equalization switch 116. While the first capacitor 114 and the second capacitor 117 are shown as p-type MOSCAPs, it should be understood that other appropriately sized types of capacitors may be used.

The offset canceling single ended sense amplifier circuit 120 may include a second equalization switch 123 coupled between the sense amplifier input 121 and the sense amplifier output 122, a first inverter 124 having a first inverter input coupled to the sense amplifier input 121 and a first inverter output coupled to the sense amplifier output 122, a second inverter 125 having a second inverter input coupled to the sense amplifier output 122 and a second inverter output coupled to the sense amplifier input 121, a third equalization switch 126 coupled between the sense amplifier input 121 and the sense amplifier output 122, a first latch switch 127 coupled between the second equalization switch 123 and the third equalization switch 126, a second latch switch 128 coupled between the first inverter 124 output and the second inverter 125 input, and a third capacitor 129 coupled between the first inverter 124 output and the second inverter 125 input. While the third capacitor 129 is shown as p-type MOSCAP, it should be understood that other appropriately sized types of capacitors may be used.

The cell array 130 may include a bit line transistor 132, a data resistor 133 coupled to the bit line transistor 132, a word line transistor 134 coupled in series with the data resistor 133, a reference resistor 135 coupled to the bit line transistor 132 in parallel with the data resistor 133, an equalization transistor 136 coupled in series with the reference resistor 135, a select line transistor 137 coupled between the ground 131 and both the equalization transistor 136 and the word line transistor 134.

Figure 2:
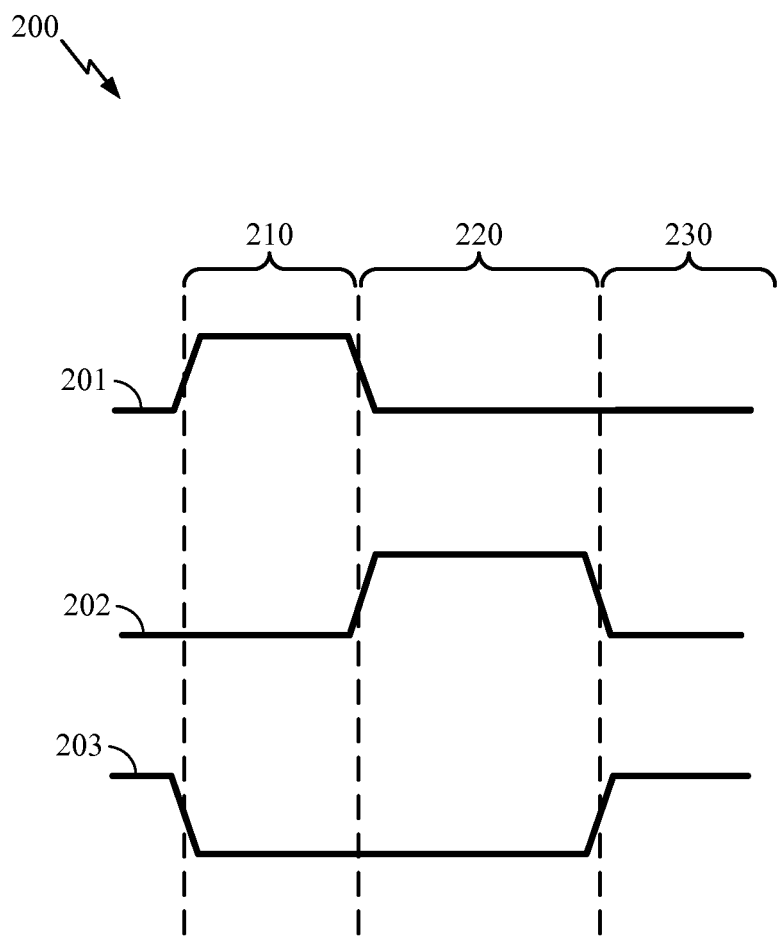
FIG. 2 illustrates exemplary timing diagram in accordance with some examples of the disclosure.

FIG. 2 illustrates exemplary timing diagram in accordance with some examples of the disclosure. The timing diagram 200 illustrates the three phase of operation for the integrated logic sensing circuit 100. As shown in FIG. 2, the first phase 210 begins with the activation of an equalization signal 201 switching from a logical low to a logic high value, a word line signal 202 stays at a logical low value, and a latch signal 203 switches from a logical high to a logical low value. The first phase 210 pre-charges the bit line and equalizes the circuit 100. In the second phase 220, the equalization signal 201 is switched from a logical high to a logical low value, the word line signal 202 is activated by switching from a logical low to a logical high value, and the latch signal 203 stays at a logical low value. The second phase 220 develops the voltage of the sense circuit output 112 and amplifies the sensed current. In the third phase 230, the equalization signal 201 stays at a logical low value, the word line signal 202 switches from a logical high to a logical low value, and the latch signal 203 is activated by switching from a logical low to a logical high value. The third phase latches a rail to rail voltage to the supply voltage 111 or ground 131.

Figure 3:
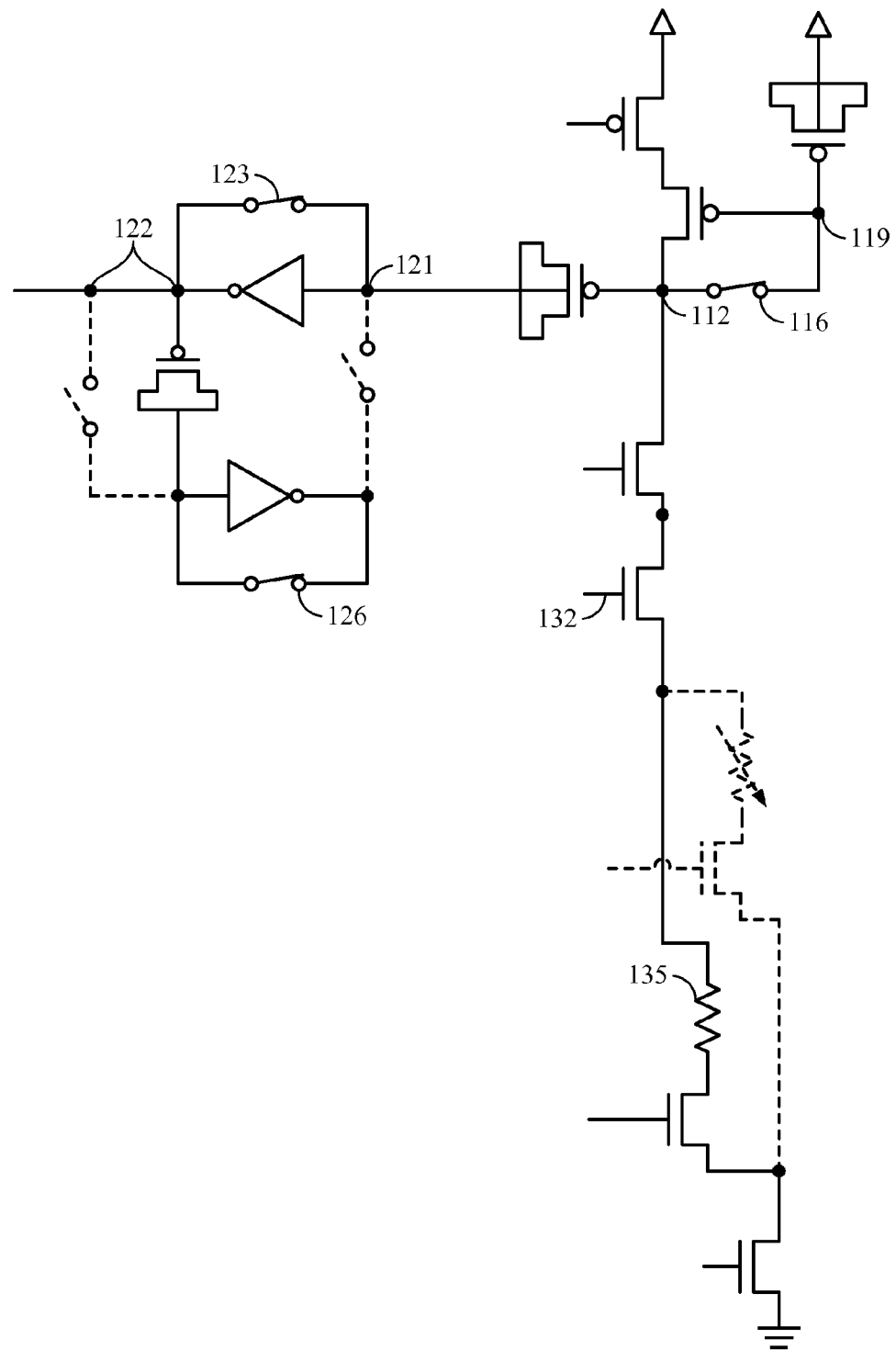
FIG. 3 illustrates an exemplary first phase of operation for an integrated logic circuit in accordance with some examples of the disclosure.

FIG. 3 illustrates an exemplary first phase of operation for an integrated logic circuit in accordance with some examples of the disclosure. As shown in FIG. 3, the first phase 210 begins by activation of the equalization signal 201. Activation of the equalization signal 201 causes the first equalization switch 116, the second equalization switch 123, and the third equalization switch 126 to close. This allows the reference resistor to be connected to the bit line transistor 132. At this point, the voltage of the sense circuit output 112 becomes the voltage at node 119 (Vref). At the same time, the sense amplifier input 121 and the sense amplifier output 122 are equalized for offset cancellation of the sense amplifier circuit 120. As discussed with reference to FIG. 4, the voltage of the sense amplifier input 121 and the voltage of the sense amplifier output 122 move to a voltage trip point 401 (see FIG. 4).

Figure 4:
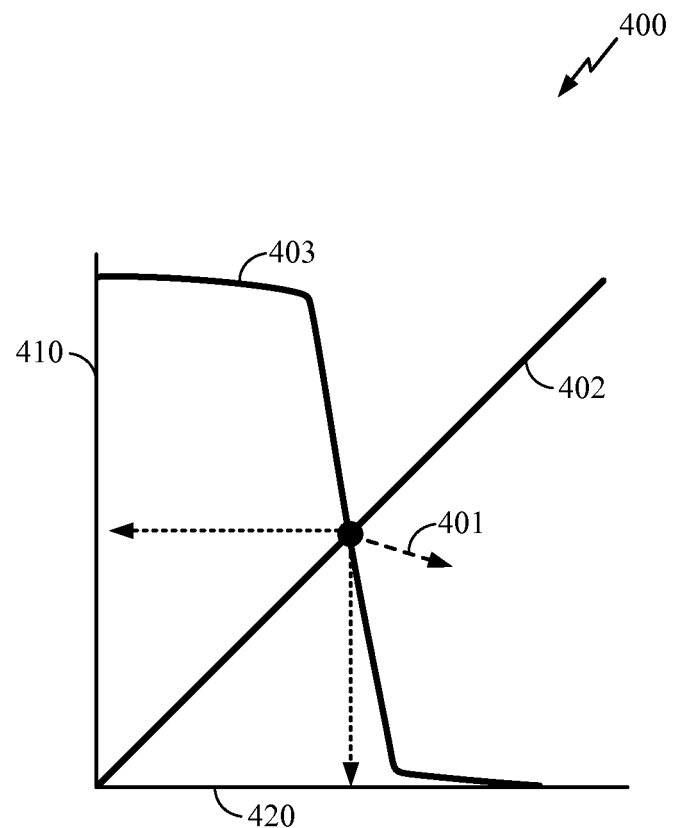
FIG. 4 illustrates exemplary voltage tripping point graph for an integrated logic circuit in accordance with some examples of the disclosure.

FIG. 4 illustrates exemplary voltage tripping point graph for an integrated logic circuit in accordance with some examples of the disclosure. As shown in FIG. 4, a voltage graph 400 shows a voltage value 410 of the sense amplifier output 122 versus a voltage value 420 of the sense amplifier input 121. A voltage trip point 401 occurs at the intersection of the sense amplifier voltage 402 and the node voltage (Vref) 403. The sense amplifier voltage 402 is the equalized voltage of the sense amplifier output 122 and the sense amplifier input 121 during the first phase 210 and the node voltage 403 is the voltage at the node 119 during the same first phase 210. During the first phase 210, the second equalization switch 123 forces the first inverter 124 into negative feedback. If the inverter 124 is offset-free, the sense amplifier input 121 and the sense amplifier output 122 settle to the voltage trip point 401 (Vtrip), which is the ideal trip point. However, an offset voltage (VOS) at the first inverter 124 input shifts the voltage transfer characteristic (VTC) to the left in the FIG. 4 graph by an amount equal to VOS. Now, the sense amplifier input 121 and the sense amplifier output 122 settle to a value approximately equal to Vtrip−VOS. As a result, −VOS appears in series with the actual VOS in the sense amplifier input, canceling the offset voltage (VOS) and biasing the first inverter 124 to its ideal trip point. Thus, there is no offset voltage (VOS) in the offset canceling single ended sense amplifier circuit 120.

Figure 5:
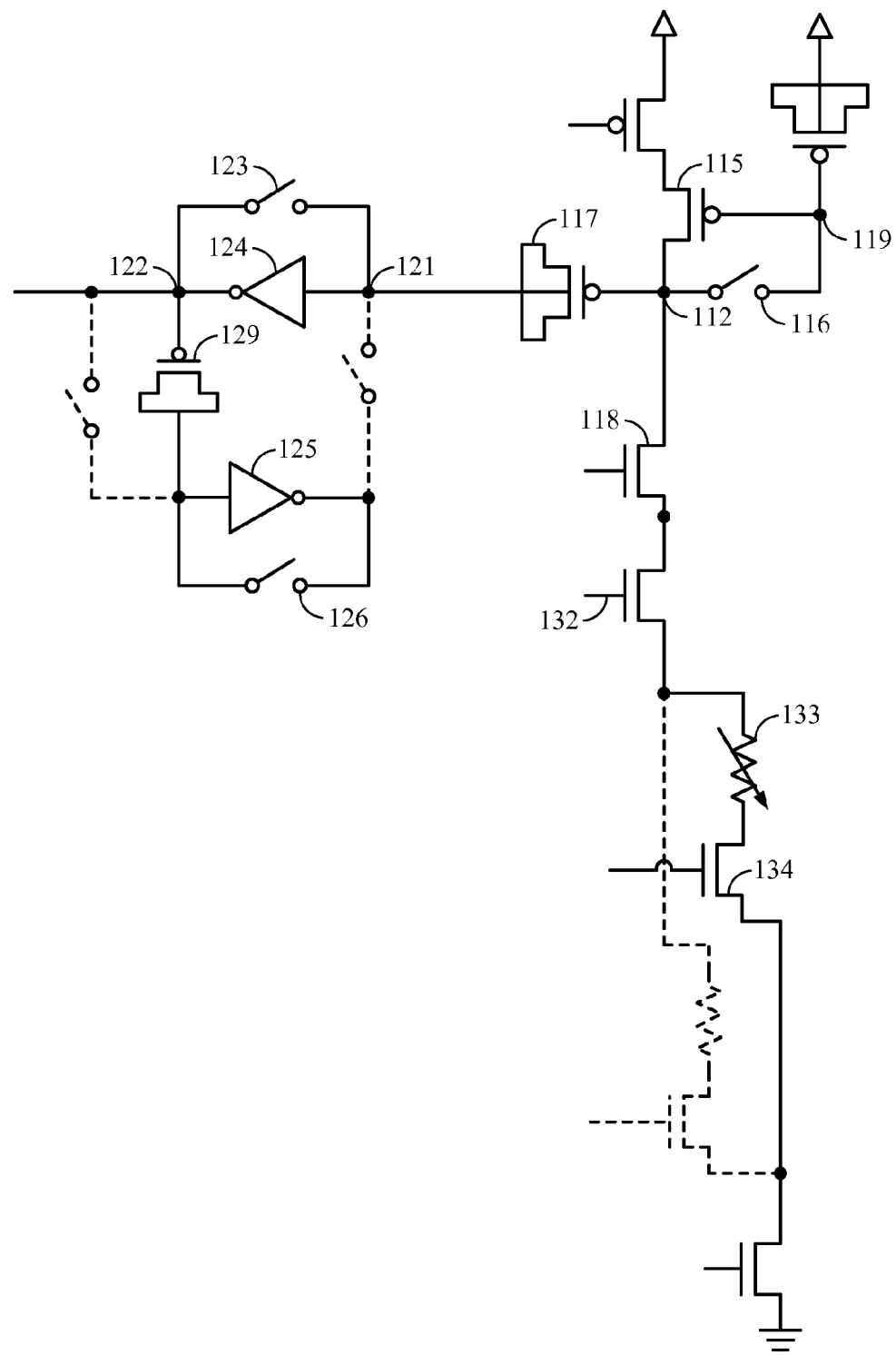
FIG. 5 illustrates an exemplary second phase of operation for an integrated logic circuit in accordance with some examples of the disclosure.

FIG. 5 illustrates an exemplary second phase of operation for an integrated logic circuit in accordance with some examples of the disclosure. As shown in FIG. 5, the second phase 220 begins with the deactivation of the equalization signal 201 and activation of the word line signal 202. Deactivation of the equalization signal 201 causes the first equalization switch 116, the second equalization switch 123, and the third equalization switch 126 to open. Activation of the word line signal 202 causes the word line transistor 134 to allow the data resistor 133 to be connected to the bit line transistor 132. In the first phase 210, the node 119 voltage (Vref) generated in the sensing circuit output 112 and stored in the first capacitor 114. Then, the voltage across the data resistor 133 (Vdata) is generated in the sensing circuit output 112 in the second phase 220. In scenarios where the resistance value of the data resistor 133 is a low value (RL), the Vdata becomes a logical low value (Vdata0), which is smaller than Vref. The opposite is true when the resistance value of the data resistor 133 is a high value (RH). It should be noted that there is no offset voltage in the offset canceling single ended sense amplifier circuit 120 because the same first transistor 115 and clamp transistor 118 are used for both the first phase 210 and the second phase 220. In addition, the capacitive coupling of the second capacitor 117 cause the voltage change ($\Delta V$) to equal the voltage across the data resistor 133 (Vdata) minus the voltage at node 119 (Vref) and be transferred into the sense amplifier input 121. Then, the sense amplifier output 122 voltage (VOUT_SA) is amplified from Vtrip1 to Vtrip1+A1*$\Delta V$. Then, A1*$\Delta V$ is transferred into the complement of the sense amplifier output 122 voltage (OUT_SA') node by third capacitor 129. Then, the voltage complement of the sense amplifier input 121 (VIN_SA') is amplified from Vtrip2 to be Vtrip2+A1*A2*$\Delta V$. A1(A2) is defined as an inverter gain of $\Delta$VOUT_SA/$\Delta$VIN_SA ($\Delta$VIN_SA'/$\Delta$VOUT_SA').

Figure 6:
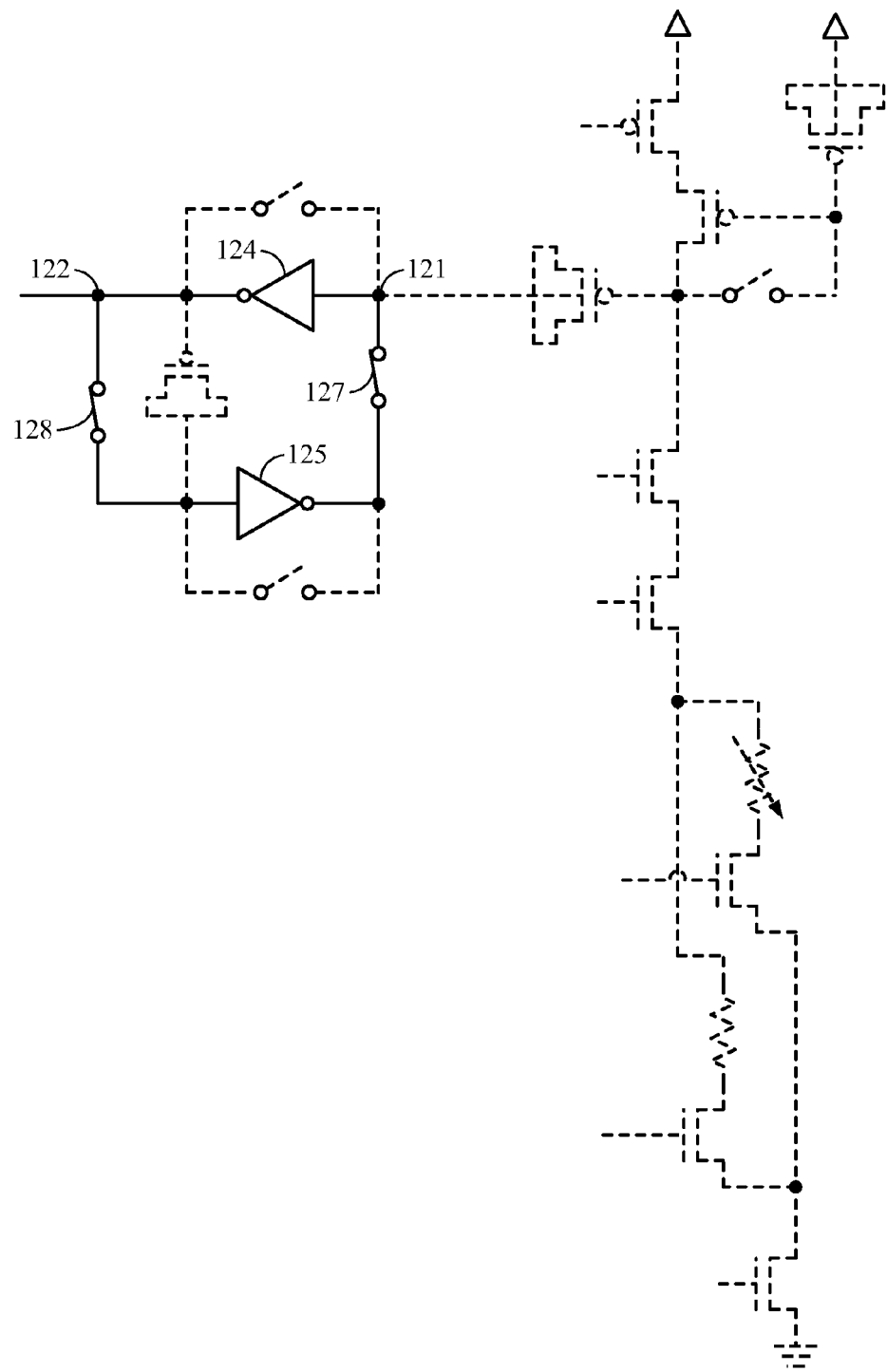
FIG. 6 illustrates exemplary third phase of operation for an integrated logic circuit in accordance with some examples of the disclosure.

FIG. 6 illustrates exemplary third phase of operation for an integrated logic circuit in accordance with some examples of the disclosure. As shown in FIG. 6, the third phase 230 begins with the activation of the latch signal 203 and deactivation of the word line signal 202. Activation of the latch signal 203 causes the first latch switch 127 and the second latch switch 128 to close. At this point, the voltage difference between voltage at the sense amplifier input 121 (VIN_SA) and the voltage at the sense amplifier output 122 (VOUT_SA) become the rail-to-rail voltage (the supply voltage 111 or ground 131) and are latched.

The examples described above have many advantages over conventional approaches. For instance, a higher sensing margin is obtained because both the offset canceling single ended sensing circuit and the offset canceling single ended amplifier have manufacturing process variation tolerant characteristics. Thus, the sensing margin is significantly improved. Lower energy consumption is obtained because the single-ended structure has only a data branch (no reference branch), which results in the reduction of energy consumption by half compared to the conventional sensing schemes. In addition, if the improved sensing margin is greater than the target sensing margin, the sensing time can be reduced by trading off the improved sensing margin, resulting in the reduction in the read energy/bit.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Nothing stated or illustrated depicted in this application is intended to dedicate any component, step, feature, benefit, advantage, or equivalent to the public, regardless of whether the component, step, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated logic sensing circuit, comprising:
   an offset canceling single ended sensing circuit coupled to a supply voltage and having a sense circuit output, wherein the offset canceling single ended sensing circuit further comprises:
   a degeneration latch transistor coupled to the supply voltage;
   a first capacitor coupled to the supply voltage;
   a first transistor coupled to the degeneration latch transistor and the first capacitor;
   a first equalization switch coupled to the first capacitor and the first transistor; and
   a second capacitor coupled to the first equalization switch and the first transistor;
   an offset canceling single ended sense amplifier circuit having a sense amplifier input coupled to the offset canceling single ended sensing circuit and a sense amplifier output;
   a voltage clamp transistor coupled after the sense circuit output; and
   a cell array coupled to the voltage clamp transistor and a ground.

2. The integrated logic sensing circuit of claim 1, wherein the first capacitor and the second capacitor are a p-type MOSCAP.

3. The integrated logic sensing circuit of claim 1, wherein the offset canceling single ended sense amplifier circuit further comprises:
   a second equalization switch coupled between the sense amplifier input and the sense amplifier output;
   a first inverter having a first inverter input coupled to the sense amplifier input and a first inverter output coupled to the sense amplifier output;
   a second inverter having a second inverter input coupled to the sense amplifier output and a second inverter output coupled to the sense amplifier input;
   a third equalization switch coupled between the sense amplifier input and the sense amplifier output;
   a first latch switch coupled between the second equalization switch and the third equalization switch;
   a second latch switch coupled between the first inverter output and the second inverter input; and
   a third capacitor coupled between the first inverter output and the second inverter input.

4. The integrated logic sensing circuit of claim 3, wherein the third capacitor is a p-type MOSCAP.

5. The integrated logic sensing circuit of claim 1, wherein the cell array further comprises:
   a bit line transistor coupled to the voltage clamp transistor;
   a data resistor coupled to the bit line transistor;
   a word line transistor coupled in series with the data resistor;
   a reference resistor coupled to the bit line transistor in parallel with the data resistor;
   an equalization transistor coupled in series with the reference resistor;
   a select line transistor coupled between the ground and both the equalization transistor and the word line transistor.

6. The integrated logic sensing circuit of claim 1, wherein the cell array comprises a memory cell.

7. The integrated logic sensing circuit of claim 1, wherein the integrated logic sensing circuit is incorporated into a device selected from a group consisting of a set top box, a music player, a video player, an entertainment unit, a navigation device, a communications device, a personal digital assistant (PDA), a fixed location data unit, and a computer, and further including the device.

8. A sensing system, comprising:
   a sensing circuit, the sensing circuit being an offset canceling single ended sensing circuit;
   a sense amplifier coupled to the sensing circuit, the sense amplifier being an offset canceling single ended sense amplifier;
   an equalization transistor coupled to the sensing circuit and configured to selectively couple a select line transistor to the sensing circuit; and
   a word line transistor coupled to the sensing circuit and in parallel with the equalization transistor, the word line transistor configured to selectively couple the select line transistor to the sensing circuit.

9. The sensing system of claim 8, wherein the sensing circuit further comprises:
a latch transistor coupled to a supply voltage, wherein a gate of the latch transistor is coupled to a control signal;
a first transistor coupled to the latch transistor;
a first capacitor coupled to a gate of the first transistor and the supply voltage;
a second capacitor coupled to an output of the sensing circuit and a drain of the first transistor;
a first equalization switch coupled to the output of the sensing circuit and the gate of the first transistor; and
a clamp transistor coupled to the drain of the first transistor and a bit line transistor.

10. The sensing system of claim 9, wherein the first capacitor and the second capacitor are a p-type MOSCAP.

11. The sensing system of claim 9, wherein the sense amplifier further comprises:
a first inverter coupled to the second capacitor and a third capacitor;
a second inverter coupled to the third capacitor and a first latch switch, the third capacitor being coupled to an output of the first inverter and an input of the second inverter;
a second equalization switch coupled to the first inverter;
a third equalization switch coupled to the second inverter;
a second latch switch coupled to the output of the first inverter and the input of the second inverter; and
the first latch switch being coupled to an input of the first inverter and an output of the second inverter.

12. The sensing circuit of claim 11, wherein the third capacitor is a p-type MOSCAP.

13. The sensing circuit of claim 11, further comprising:
a data resistor coupled to the bit line transistor, the bit line transistor being coupled to the clamp transistor and the word line transistor being coupled in series with the data resistor;
a reference resistor coupled to the bit line transistor in parallel with the data resistor, the equalization transistor being coupled in series with the reference resistor; and
wherein the select line transistor is coupled between a ground and both the equalization transistor and the word line transistor.

14. The sensing system of claim 11, further comprising a memory cell selectively coupled to the sensing circuit for reading a data value in the memory cell.

15. The sensing system of claim 14, wherein the sensing system is incorporated into a device selected from a group consisting of a set top box, a music player, a video player, an entertainment unit, a navigation device, a communications device, a personal digital assistant (PDA), a fixed location data unit, and a computer, and further including the device.

16. A method of sensing and amplifying a current in a memory cell, comprising:
executing a first phase of operation for an integrated logic circuit coupled to the memory cell, the first phase of operation pre-charging a bit line transistor in the integrated logic circuit and equalizing a sense amplifier in the integrated logic circuit;
executing a second phase of operation for the integrated logic circuit, the second phase of operation developing an output voltage of a sensing circuit from a reference voltage to a data voltage and amplifying an output voltage of the sense amplifier; and
executing a third phase of operation for the integrated logic circuit, the third phase of operation latching a rail to rail voltage to a value defined by a difference of the output voltage of the sensing circuit and an input voltage of the sensing circuit.

17. The method of claim 16, wherein the first phase of operation comprises:
activation of an equalization signal that causes a first equalization switch, a second equalization switch, and a third equalization switch in the sensing circuit to close and causes the output voltage of the sensing circuit to become the reference voltage; and
equalization of an input voltage of the sense amplifier and the output voltage of the sense amplifier.

18. The method of claim 17, wherein the second phase of operation comprises:
deactivation of the equalization signal that causes the first equalization switch, the second equalization switch, and the third equalization switch to open; and
activation of a word line signal that causes a word line transistor to allow a data resistor to be connected to the bit line transistor and the output voltage of the sensing circuit to shift from the reference voltage to the data voltage.

19. The method of claim 18, wherein the third phase of operation comprises:
activation of a latch signal that causes a first latch switch in the sensing circuit and a second latch switch in the sense amplifier to close; and
deactivation of the word line signal that causes a voltage difference between the input voltage of the sense amplifier and the output voltage of the sense amplifier to become the rail-to-rail voltage of the integrated logic circuit.

* * * * *